(12) United States Patent
Matsubara (10) Patent No.: US 10,374,025 B2
(45) Date of Patent: Aug. 6, 2019

(54) THIN FILM TRANSISTOR ARRAY

(71) Applicant: TOPPAN PRINTING CO., LTD., Taito-ku (JP)

(72) Inventor: Ryohei Matsubara, Taito-ku (JP)

(73) Assignee: TOPPAN PRINTING CO., LTD., Taito-ku (JP)

( * ) Notice: Subject to any disclaimer, the term of this patent is extended or adjusted under 35 U.S.C. 154(b) by 0 days.

(21) Appl. No.: 14/701,145

(22) Filed: Apr. 30, 2015

(65) Prior Publication Data

US 2015/0236083 A1  Aug. 20, 2015

Related U.S. Application Data

(63) Continuation of application No. PCT/JP2013/005312, filed on Sep. 6, 2013.

(30) Foreign Application Priority Data

Oct. 31, 2012  (JP) ................. 2012-240440

(51) Int. Cl.
*H01L 27/28* (2006.01)
*H01L 27/32* (2006.01)
(Continued)

(52) U.S. Cl.
CPC ........ *H01L 27/3274* (2013.01); *H01L 27/283* (2013.01); *H01L 27/3248* (2013.01);
(Continued)

(58) Field of Classification Search
CPC ............. H01L 27/3248; H01L 27/3262; H01L 27/3274; H01L 27/3265; H01L 27/3276;
(Continued)

(56) References Cited

U.S. PATENT DOCUMENTS 6,150,668 A * 11/2000 Bao ............... H01L 27/3248
257/40
7,295,255 B2 * 11/2007 Jun ............... G02F 1/13394
349/155
(Continued)

FOREIGN PATENT DOCUMENTS

CN    101765906 A    6/2010
JP    2001-250953    9/2001
(Continued)

OTHER PUBLICATIONS

International Search Report and Written Opinion dated Dec. 10, 2013 in PCT/JP2013/005312 (with English Translation).
(Continued)

*Primary Examiner* — Allen L Parker
*Assistant Examiner* — Charles N Ausar-El
(74) *Attorney, Agent, or Firm* — Oblon, McClelland, Maier & Neustadt, L.L.P.

(57) ABSTRACT

A thin film transistor array includes thin film transistors each including a gate electrode formed on an insulation substrate, a source electrode and a drain electrode formed on the gate electrode via a gate insulation film and a semiconductor layer formed on a portion of the gate electrode surrounded by at least the source electrode and the drain electrode; capacitors each including a capacitor electrode formed on the insulation substrate and a pixel electrode which is formed on the capacitor electrode via the gate insulation film and connected to the drain electrode, the capacitors and the thin film transistors being positioned in a matrix along a first direction and a second direction perpendicular to the first direction; and connection lines that connect semiconductor layers of the thin film transistors positioned in the first direction. The connection lines each have a width smaller than a width of the semiconductor layer.

20 Claims, 7 Drawing Sheets

(51) Int. Cl.
*H01L 49/02* (2006.01)
*H01L 51/00* (2006.01)
*H01L 51/05* (2006.01)

(52) U.S. Cl.
CPC ...... *H01L 27/3262* (2013.01); *H01L 27/3265* (2013.01); *H01L 27/3276* (2013.01); *H01L 28/40* (2013.01); *H01L 51/0096* (2013.01); *H01L 51/0097* (2013.01); *H01L 51/0545* (2013.01); *H01L 51/0558* (2013.01); *H01L 51/0005* (2013.01); *H01L 51/0022* (2013.01); *H01L 51/0094* (2013.01)

(58) Field of Classification Search
CPC . H01L 28/40; H01L 51/0096; H01L 51/0097; H01L 51/0545
USPC .......................................................... 257/40
See application file for complete search history.

(56) References Cited

U.S. PATENT DOCUMENTS

| | | | | |
|---|---|---|---|---|
| 8,110,858 | B2* | 2/2012 | Matsubara | H01L 27/283 257/287 |
| 8,426,860 | B2* | 4/2013 | Sato | H01L 29/78654 257/59 |
| 8,704,234 | B2* | 4/2014 | Kubota | H01L 27/326 257/72 |
| 8,963,147 | B2* | 2/2015 | Imamura | 257/43 |
| 2003/0138998 | A1 | 7/2003 | Yamazaki et al. | |
| 2006/0132461 | A1* | 6/2006 | Furukawa | H01L 27/3274 345/173 |
| 2007/0046213 | A1* | 3/2007 | Nakamura | H01L 27/326 315/169.3 |
| 2007/0138471 | A1 | 6/2007 | Lim et al. | |
| 2007/0252142 | A1* | 11/2007 | Yoon | H01L 27/1214 257/40 |
| 2007/0252928 | A1* | 11/2007 | Ito | G02F 1/1362 349/106 |
| 2008/0197348 | A1 | 8/2008 | Matsubara et al. | |
| 2008/0239189 | A1* | 10/2008 | Hatta | H01L 29/7869 349/46 |
| 2009/0121225 | A1* | 5/2009 | Ishizaki | H01L 27/1225 257/59 |
| 2010/0193775 | A1* | 8/2010 | Yutani | H01L 51/0015 257/40 |
| 2012/0001189 | A1* | 1/2012 | Matsubara | G02F 1/136286 257/59 |
| 2012/0262642 | A1* | 10/2012 | Ikeda | H01L 27/124 349/46 |
| 2013/0015449 | A1* | 1/2013 | Lee | H01L 27/1255 257/59 |
| 2014/0027717 | A1* | 1/2014 | van Aerle | H01L 27/3274 257/40 |
| 2017/0352777 | A1* | 12/2017 | Yamazaki | H01L 27/1225 |

FOREIGN PATENT DOCUMENTS

| | | |
|---|---|---|
| JP | 2003-303973 | 10/2003 |
| JP | 2005-210086 | 8/2005 |
| JP | 2008-235861 | 10/2005 |
| JP | 2006-63334 | 3/2006 |
| JP | 2007-164197 | 6/2007 |
| JP | 2007-183629 A | 7/2007 |
| JP | 2008-192715 A | 8/2008 |
| JP | 2008-270744 | 11/2008 |
| JP | 2009-224665 | 10/2009 |
| JP | 2012-018970 | 1/2012 |

OTHER PUBLICATIONS

Office Action dated Jul. 5, 2016, in Japanese Patent Application No. 2012-240440, filed Oct. 31, 2012 (with English-language Translation).

Combined Office Action and Search Report dated Aug. 22, 2017 in Chinese Patent Application No. 201380053653.X (with partial English translation of Office Action and translation of categories of cited documents).

\* cited by examiner

THIN FILM TRANSISTOR ARRAY

CROSS-REFERENCE TO RELATED APPLICATIONS

The present application is a continuation of International Application No. PCT/JP2013/005312, filed Sep. 6, 2013, which is based upon and claims the benefits of priority to Japanese Application No. 2012-240440, filed Oct. 31, 2012. The entire contents of these applications are incorporated herein by reference.

BACKGROUND OF THE INVENTION

Field of the Invention

The present invention relates to a thin film transistor array using a printing technique.

Discussion of the Background

According to the remarkable development of information technology nowadays, information is frequently transmitted and received with lap-top computers or portable information terminals. It is common knowledge that a ubiquitous society enabling information to be exchanged anywhere will be attained in the near future. In such a society, a lighter and slim information terminal is desirable. Currently, as a semiconductor material, silicon based materials are mainly employed and, as a manufacturing method, photolithography is generally used.

On the other hand, printable electronics in which an electrical component is manufactured by using a printing technique are attracting attention. By using a printing technique, the following advantages can be attained, that is, equipment cost and manufacturing cost are reduced compared to using photolithography and, since a vacuum environment and high temperature environment are not necessary, a plastic substrate can be used. In this case, as a semiconductor material, an organic semiconductor or an oxide semiconductor which are soluble in an organic solvent are often used. Thus, a semiconductor layer can be formed by a printing method. For example, according to patent literature 1, an organic semiconductor layer is formed by an inkjet method. In patent literature 2, an organic semiconductor layer is formed by a flexographic printing. Also, in patent literature 3, an organic semiconductor layer is formed by letterpress offset printing.

Patent Literature 1
Japanese Patent Application Laid-Open Publication No. 2005-210086
Patent Literature 2
Japanese Patent Application Laid-Open Publication No. 2006-63334
Patent Literature 3
Japanese Patent Application Laid-Open Publication No. 2009-224665

SUMMARY OF THE INVENTION

According to one aspect of the present invention, a thin film transistor array includes thin film transistors each including a gate electrode formed on an insulation substrate, a source electrode and a drain electrode formed on the gate electrode via a gate insulation film and a semiconductor layer formed on a portion of the gate electrode surrounded by at least the source electrode and the drain electrode; capacitors each including a capacitor electrode formed on the insulation substrate and a pixel electrode which is formed on the capacitor electrode via the gate insulation film and connected to the drain electrode, the capacitors and the thin film transistors being positioned in a matrix along a first direction and a second direction perpendicular to the first direction; and connection lines that connect semiconductor layers of the thin film transistors positioned in the first direction. Each of the connection lines has a width smaller than a width of the semiconductor layer of the thin film transistor.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Hereinafter, with reference to the drawings, embodiments of the thin film transistor array will now be described. In the respective drawings to be referenced, portions having identical configuration in the respective drawings described below are labeled with the same symbols.

(First Embodiment)

Figure 1:
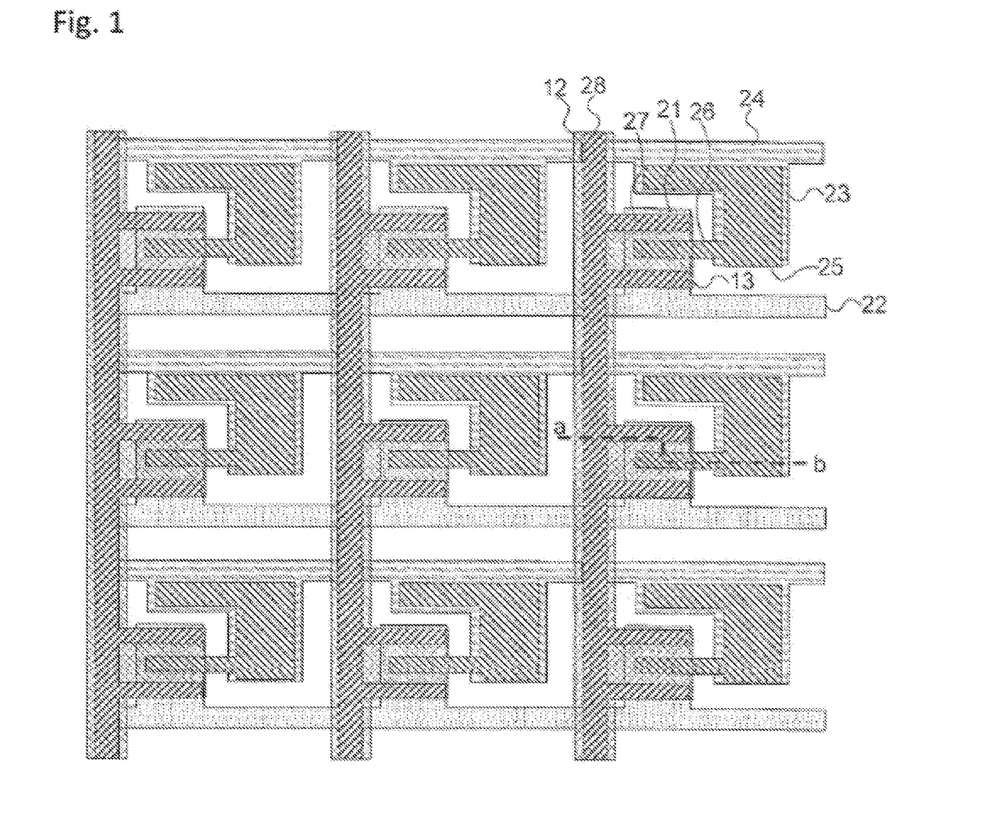
FIG. 1 is a planar view showing a configuration of a thin film transistor array according to the first embodiment of the present invention.

First, with reference to FIG. 1, a configuration of the thin film transistor array according to the first embodiment is described. FIG. 1 is a planar view showing a configuration of a thin film transistor array according to the first embodiment. The thin film transistor array as shown in FIG. 1 is arranged such that a thin film transistor and a capacitor are arranged in a first direction (vertical direction in FIG. 1) and a second direction (horizontal direction in FIG. 1). According to the present embodiment, the thin film transistor array is arranged in a matrix with 3 rows and 3 columns.

As shown in FIG. 1, one thin film transistor is constituted by a gate electrode 21, a source electrode 27, a drain electrode 26 and a semiconductor layer 13. The semiconductor layer 13 is formed on a region where the gate electrode 21, the source electrode 27 and the drain electrode 26 are overlapped, and formed on a region of the gate electrode 21 surrounded by at least the source electrode 27 and the drain electrode 26. One capacitor is constituted by a capacitor electrode 23 and a pixel electrode 25. The drain electrode 26 and the pixel electrode 25 are mutually connected. When a pair of electrodes turn on, current flows to the pixel electrode 25 from the drain electrode 26, and then the capacitor is charged so that the pixel lights.

The gate electrodes 21 that constitute respective thin film transistors arranged in a horizontal direction are mutually connected by a gate wiring 22. The source electrodes 27 that constitute respective thin film transistors arranged in vertical direction are mutually connected by a source wiring 28. The semiconductor layers 13 that constitute the thin film transistors arranged in a vertical direction are mutually connected by a semiconductor layer connection line 12. The semiconductor layer connection line 12 is formed to extend in a direction identical to the source wiring 28. The capacitor electrodes 23 of capacitors arranged in a horizontal direction are mutually connected by a capacitor wiring 24.

Figure 2:
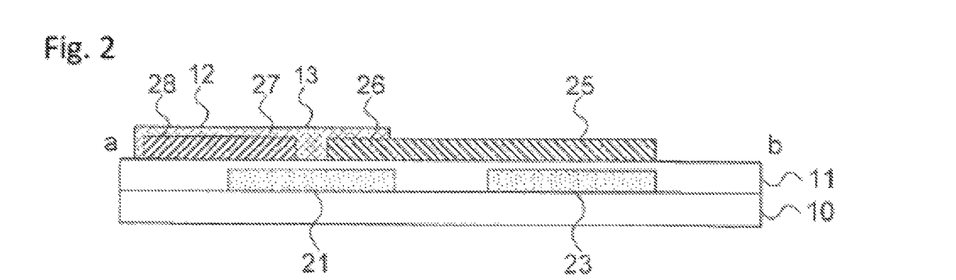
FIG. 2 is a cross sectional view showing a cross section of the thin film transistor array according to the first embodiment of the present invention.

Next, with reference to FIG. 2, a cross section of the thin film transistor array according to the first embodiment is described. FIG. 2 is a cross sectional view that illustrates a cross section of the thin film transistor array according to the first embodiment. FIG. 2 shows a cross section taken along a dotted line a to b in FIG. 1. As shown in FIG. 2, the gate electrode 21 is formed on an insulation substrate 10, and the source electrode 27 and the drain electrode 26 are formed on the gate electrode 21 via a gate insulation film 11. The source electrode 27 is connected to the source wiring 28. The semiconductor layer 13 is formed on a region where the gate electrode 21, the source electrode 27 and the drain electrode 26 are overlapped, and formed on a region of the gate electrode 21 surrounded by at least the source electrode 27 and the drain electrode 26. The semiconductor layer 13 is connected to the semiconductor layer connection line 12.

The capacitor electrode 23 is formed on the insulation substrate 10 and the pixel electrode 25 is formed on the capacitor electrode 23 via the gate insulation film 11. The pixel electrode 25 is connected to the drain electrode 26. In the first embodiment, the semiconductor layer connection line 12 is preferably formed in a stripe shape extending over a plurality of thin film transistors. Thus, thin film transistors can be manufactured with high throughput and high alignment accuracy. Further, thin film transistors having little variance between transistor elements and high on/off ratio can be manufactured.

Since the width of the semiconductor layer connection line 12 in the non-channel region is narrower than the width of the semiconductor layer 13 in the channel region, the area of the pixel electrode 25 can be large. Specifically, if the width of the semiconductor layer connection line 12 in the non-channel region were wider than or equal in width to the channel region, to reduce leak current, the pixel electrode 25 would preferably not contact the thin film transistor, and the pixel electrode would have to be small. However, when the width of the semiconductor layer connection line 12 in the non-channel region is small, the pixel electrode 25 can be large but not contact the thin film. Hence, by having the large capacitor electrode 23, a large charge storage capacity is possible. As a result, when driving a display device using the thin film transistor array, stable driving thereof can be achieved.

In the present embodiment, as an insulation substrate 10, a flexible substrate may preferably be used. As a material generally used, plastic material such as polyethylene-terephthalate (PET), polyimide, polyethersulfone (PES), polyethylene-naphthalate (PEN) and polycarbonate can be used. A glass substrate such as quartz or a silicon wafer can be used for the insulation substrate 10. However, taking requirements of thinness, light weight and flexibility into consideration, a plastic substrate may preferably be used.

Also, taking the temperature used for each manufacturing process into consideration, PEN or polyimide may preferably be used for the insulation substrate 10.

In the present embodiment, the materials used for the electrode are not limited to specific materials. However, as conductive materials generally used, metals such as gold, platinum, nickel and indium tin oxide, or a thin film made of oxide or a conductive polymer such as poly (ethylenedioxythiphene)/polystyrene sulfonate (PEDOT/PSS) and polyaniline or a solution in which metal colloidal particles such as gold, silver or nickel are dispersed or a thick film paste in which metal particles such as silver is used are suitable. The method for forming the electrode is not limited to any specific method. Hence, dry film formation such as depositions or sputtering may be used. However, taking requirements of flexibility and low cost into consideration, screen printing, wet film formation such as reverse offset printing, letterpress printing or an inkjet method may preferably be used.

In the present embodiment, the material for the gate insulation layer 11 is not limited to any specific material. For this material generally used, a polymer solution such as polyvinyl phenol, polymethylmethacrylate, polyimide, polyvinylalcohol or epoxy resin, or a solution in which particles such as alumina or silica gel are dispersed, can be used. As a gate insulation film 11, thin films made of PET or PEN may be employed.

In the present embodiment, a material used for the semiconductor layer 13 and the semiconductor layer connection line 12 is not limited to any specific materials. Generally used materials include polythiophene, polyallylamine, fluorenebithiophene-copolymer and polymer-based organic semiconductor materials which are similar to these derivatives, or pentacene, tetracene, copper phthalocyanine, perylene and low-molecule-based organic semiconductor material which are similar to these derivatives may be used. However, considering requirements of low cost, flexibility and large area, it is preferable to use an organic semiconductor material to which a printing method can be applied. Also, carbon compounds such as carbon nanotubes or fullerenes or nano-sized semiconductor particle dispersions may be used as a semiconductor material.

As a printing method for forming the semiconductor layer 13 and the semiconductor layer connection line 12, publicly-known methods such as gravure printing, offset printing, screen printing or an inkjet method can be used. Generally, since the above-described organic semiconductor materials have low solubility in the solvent, it is preferable to use printing methods such as letterpress printing, reverse offset printing, an inkjet method and a dispenser which are suitable for low viscosity solution. Specifically, letterpress printing is most preferable for the printing method because the printing time required is short and it consumes less ink, and is suitable for stripe-shape printing. Forming the semiconductor layer connection line 12 to be a stripe-shape in this way, the distribution of the film thickness due to unevenness of the anilox is averaged. Hence, the film thickness of the semiconductor layer 13 and the semiconductor layer connection line 12 become constant, whereby the TFT characteristics can be equalized.

In the thin film transistor array according to the present embodiment, a sealing layer, an interlayer insulation film, an upper pixel electrode, a gas barrier layer or a planarization film may be formed as needed. Moreover, in the thin film transistor array, source and drain are named as a matter of convenience, and these names may be reversed. According to the present embodiment, the electrode connected to the source wiring 28 is defined as the source electrode 27 and the electrode connected to the pixel electrode 25 is defined as the drain electrode 26.

(Second Embodiment)

Figure 3:
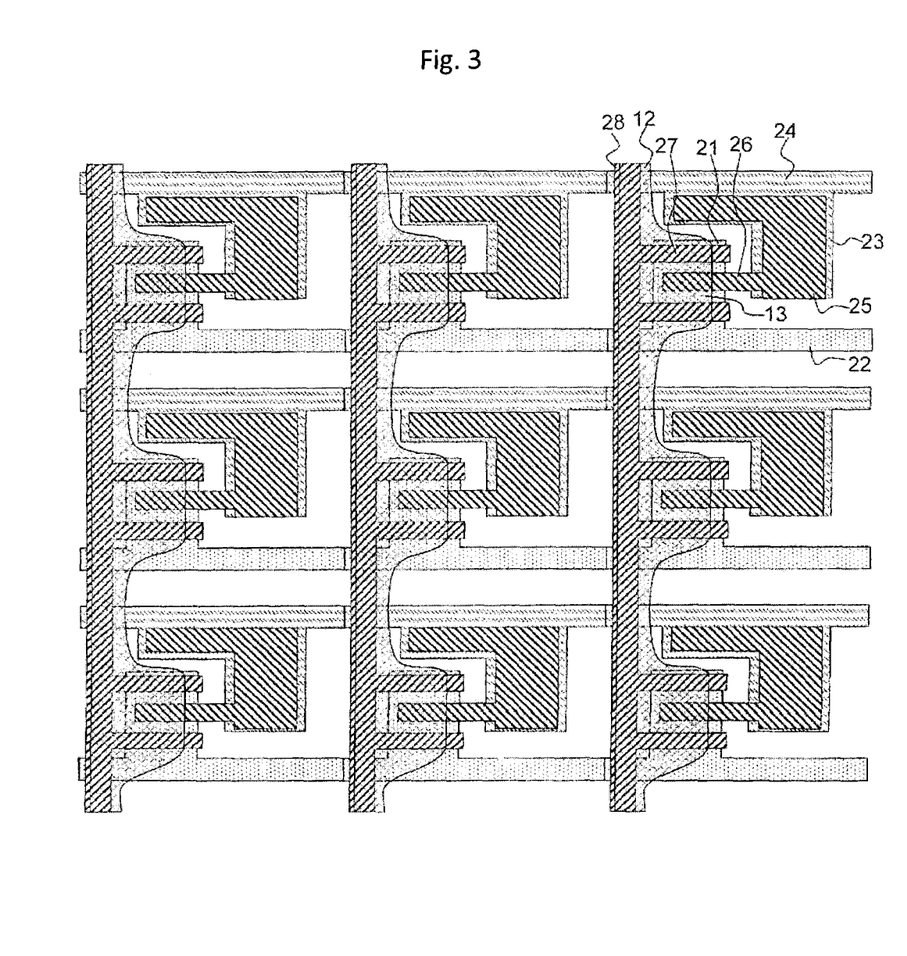
FIG. 3 is a planar view showing a configuration of a thin film transistor array according to the second embodiment of the present invention.

With reference to FIG. 3, a configuration of the thin film transistor array according to the second embodiment is described as follows. FIG. 3 is a planar view showing a thin film transistor array according to the second embodiment. The thin film transistor array as shown in FIG. 3 is arranged such that a thin film transistor and a capacitor are arranged in a first direction (vertical direction in FIG. 3) and a second direction (horizontal direction in FIG. 3). According to the present embodiment, the thin film transistor array is arranged in a matrix with 3 rows and 3 columns.

As shown in FIG. 3, one thin film transistor is constituted by a gate electrode 21, a source electrode 27, a drain electrode 26 and a semiconductor layer 13. The semiconductor layer 13 is formed on a region where the gate electrode 21, the source electrode 27 and the drain electrode 26 are overlapped, and formed on a region of the gate electrode 21 surrounded by at least the source electrode 27 and the drain electrode 26. One capacitor is constituted by a capacitor electrode 23 and a pixel electrode 25. The drain electrode 26 and the pixel electrode 25 are mutually connected. When a pair of electrodes turn on, current flows to the pixel electrode 25 from the drain electrode 26, and then the capacitor is charged so that the pixel lights.

The gate electrodes 21 that constitute respective thin film transistors arranged in a horizontal direction are mutually connected by a gate wiring 22. The source electrodes 27 that constitute respective thin film transistors arranged in vertical direction are mutually connected by a source wiring 28. The semiconductor layers 13 that constitute the thin film transistors arranged in a vertical direction are mutually connected by a semiconductor layer connection line 12. The semiconductor layer connection line 12 is formed to extend in a direction identical to the source wiring 28. The capacitor electrodes 23 of capacitors arranged in a horizontal direction are mutually connected by a capacitor wiring 24.

In the second embodiment, the semiconductor layer connection line 12 is preferably formed in a stripe shape extending over a plurality of thin film transistors. Thus, thin film transistors can be manufactured with high throughput and high alignment accuracy. Further, thin film transistors having little variance between transistor elements and high on/off ratio can be manufactured. Since the width of the semiconductor layer connection line 12 in the non-channel region is narrower than the width of the semiconductor layer 13 in the channel region, the area of the pixel electrode 25 can be large. Specifically, in a case where the width of the semiconductor layer connection line 12 in the non-channel region is wider or equal to the channel region, to reduce leak current, the pixel electrode 25 may preferably not contact the thin film transistor and so the pixel electrode 25 should be small. However, when the width of the semiconductor layer connection line 12 in the non-channel region is small, the pixel electrode 25 can be large enough not to contact with the thin film. Hence, by setting the capacitor electrode 23 to be large, charge storage capacity is able to be large. As a result, when driving the display device using the thin film transistor array, stable driving thereof can be achieved.

Further, according to the second embodiment, as shown in FIG. 3, the source electrode 27 may preferably be constituted to have a comb-tooth shape having a plurality of convex portions in which the plurality of convex portions of the source electrode 27 are arranged in the outermost part of a region where the thin film transistor is formed. Further, the semiconductor layer 13 may preferably be arranged not to cover tip portions of the plurality of convex portions of the source electrode 27 arranged in the outermost part of a region where the thin film transistor is formed. Thus, occurrence of leak current between source electrode 27 and the drain electrode 26 can be reduced.

In more detail, when a source electrode 27 of one thin film transistor and a drain electrode 26 of an adjacent thin film transistor are electrically connected via the semiconductor layer 13, since voltage potentials between the source electrode 27 and the drain electrode 26 differ, a current flows therebetween. On the other hand, according to the configuration as shown in FIG. 3, the convex portion of the source electrode 27 arranged in the outermost part of the thin film transistor is arranged between the source electrode 27 and the drain electrode 26 in the adjacent transistors, whereby leak current is unlikely to flow.

Moreover, in the configuration as shown in FIG. 3, the convex portion of the source electrode 27 arranged in the outermost part of the thin film transistor is not covered by the semiconductor layer 13 so that the drain electrode 26 of the thin film transistor is electrically connected to only the source electrode 27 in the same thin film transistor, and therefore leak current is unlikely to flow.

In the second embodiment, the insulation substrate 10, various electrode materials, the gate insulation film 11, the semiconductor layer 13 and the semiconductor layer connection line 12 can be the same components as used in the first embodiment and also the same forming method as the first embodiment can be applied.

(Third Embodiment)

Figure 4:
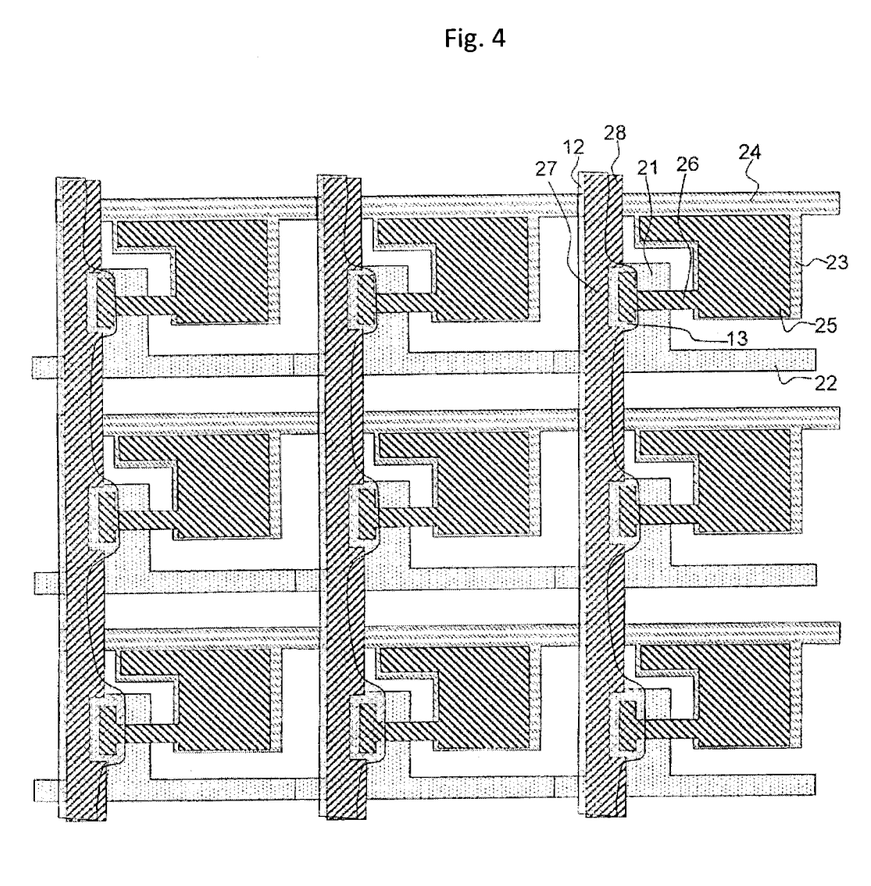
FIG. 4 is a planar view showing a configuration of a thin film transistor array according to the third embodiment of the present invention.
Figure 5:
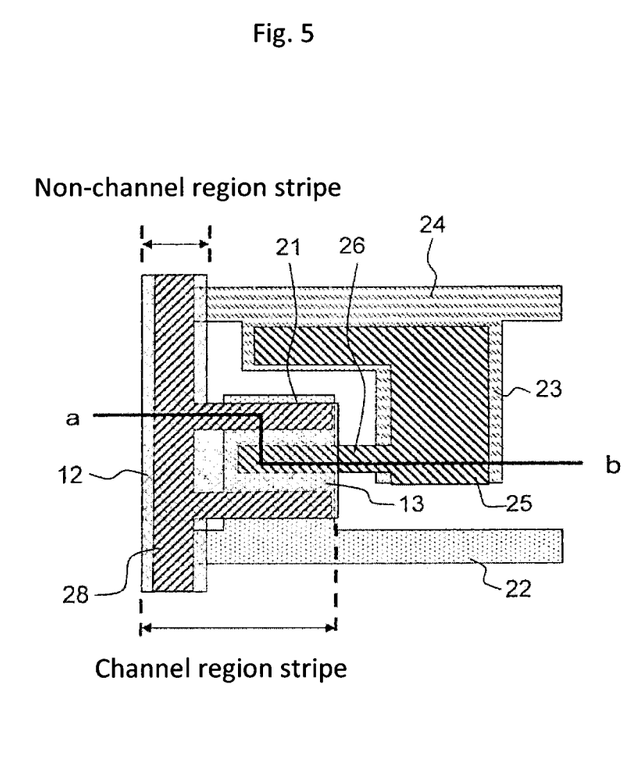
FIG. 5 is a planar view that illustrates a channel region and non-channel region of the thin film transistor array according to an embodiment of the present invention.

With reference to FIG. 4, a configuration of the thin film transistor array according to the third embodiment is described. FIG. 4 is a planar view showing a configuration of a thin film transistor array according to the third embodiment. The thin film transistor array as shown in FIG. 4 is arranged such that a thin film transistor and a capacitor are arranged in a first direction (vertical direction in FIG. 4) and a second direction (horizontal direction in FIG. 4). According to the present embodiment, the thin film transistor array is arranged in a matrix with 3 rows and 3 columns.

As shown in FIG. 4, one thin film transistor is constituted by a gate electrode 21, a source electrode 27, a drain electrode 26 and a semiconductor layer 13. The semiconductor layer 13 is formed on a region where the gate electrode 21, the source electrode 27 and the drain electrode 26 are overlapped, and formed on a region of the gate electrode 21 surrounded by at least the source electrode 27 and the drain electrode 26. One capacitor is constituted by a capacitor electrode 23 and a pixel electrode 25. The drain electrode 26 and the pixel electrode 25 are mutually connected. When a pair of electrodes turn on, current flows to the pixel electrode 25 from the drain electrode 26, and then the capacitor is charged so that the pixel lights.

The gate electrodes 21 that constitute respective thin film transistors arranged in a horizontal direction are mutually connected by a gate wiring 22. The source electrodes 27 that constitute respective thin film transistors arranged in vertical direction are mutually connected by a source wiring 28. The semiconductor layers 13 that constitute the thin film transistors arranged in a vertical direction are mutually connected by a semiconductor layer connection line 12. The semiconductor layer connection line 12 is formed to extend in a direction identical to the source wiring 28. The capacitor electrodes 23 of capacitors arranged in a horizontal direction are mutually connected by a capacitor wiring 24.

According to the third embodiment, the semiconductor layer connection line 12 may preferably be formed in a stripe shape extending over a plurality of thin film transistors. Thus, thin film transistors can be manufactured with high throughput and high alignment accuracy. Further, thin film transistors having little variance between transistor elements and high on/off ratio can be manufactured.

Since the width of the semiconductor layer connection line 12 in the non-channel region is narrower than the width of the semiconductor layer 13 in the channel region, the area of the pixel electrode 25 can be large. Specifically, if the width of the semiconductor layer connection line 12 in the non-channel region were wider than or equal in width to the channel region, to reduce leak current, the pixel electrode 25 would preferably not contact the thin film transistor, and the pixel electrode 25 would have to be small. However, when the width of the semiconductor layer connection line 12 in the non-channel region is small, the pixel electrode 25 can be large but not contact the thin film. Hence, by having a large capacitor electrode 23, a large charge storage capacity is possible. As a result, when driving a display device using the thin film transistor array, stable driving thereof can be achieved.

Further, according to the third embodiment, as shown in FIG. 4, the source electrode 27 is provided as a notch (concave portion) formed on the source wiring 28. Therefore, compared to a configuration in which the source electrode 27 is provided as a convex portion protruded from the source wiring 28, the area which the thin film transistor occupies can be smaller and the aperture ratio can be larger. According to the third embodiment, as shown in FIG. 4, the semiconductor layer connection line 12 has a region which is not overlapped with the source wiring 28 at a side portion where the notch portion of the source wiring 28 is formed (a side of the channel region where the source electrode 27 is formed). Thus, occurrence of leak current between the source electrode 27 and the drain electrode 26 in adjacent thin film transistors can be suppressed. More specifically, in cases where the source electrode 27 of one thin film transistor and the drain electrode 26 of a thin film transistor adjacent to the one thin film transistor are electrically connected with each other via the semiconductor layer 13 or the like and adjacent thin film transistors are driven differently, since the source electrode 27 and the drain electrode 26 have different voltage potentials, current flows therebetween. On the other hand, according to the configuration as shown in FIG. 4, the source wiring 28 is provided between the source electrode 27 and the drain electrode 26 in adjacent transistors so that the leak current can be prevented from easily flowing between the source electrode 27 and the drain electrode 26. In the third embodiment, the same components and manufacturing methods can be used for the insulation substrate 10, various electrode materials, the gate insulation film 11, the semiconductor layer 13 and the semiconductor layer connection line 12 as in the first embodiment.

EXAMPLE 1

With reference to the drawings, an example of the thin film transistor is described as follows. First, example 1 is described. According to the present example, as shown in FIGS. 1 and 2, a manufacturing method of a bottom gate/bottom contact type thin film transistor array is described. As an insulation substrate 10, polyethylene-naphthalate (PEN) film (produced by Teijin DuPont) was used. The gate electrode 21, gate wiring 22, capacitor electrode 23 and capacitor wiring 24 were formed by an ink jet method by using an ink in which silver nanoparticles were dispersed (produced by Harima Chemicals). As for a gate insulation film 11, polyimide (Neoplim produced by Mitsubishi Gas Chemical) was coated by a die coater and dried for an hour at 180° C.

Subsequently, the source electrode 27, the drain electrode 26, the source wiring 28 and the pixel electrode 25 are formed by an ink jet method by using an ink in which silver nanoparticles were dispersed (produced by Harima Chemicals). As a semiconductor materials, 6,13-Bis(triisopropyl-silylethynyl)pentacene ((TIPS-pentacene) produced by Aldrich) was used. A solution in which a material was dissolved into tetralin (product of Kanto Chemical) to be 2 wt % was used as an ink. Also, a photosensitive resin letterpress was used as a letterpress and a 150 dpi anilox roll was used so as to print the semiconductor using letterpress printing. The semiconductor has a stripe-shape in which the width of the stripe-shape in the non-channel region is narrower than the width of the stripe-shape in the channel region. Then, by drying for 60 minutes at 100° C., the semiconductor layer 13 and the semiconductor layer connection line 12 were formed.

According to the above-described example 1, the following advantages can be obtained. In example 1, a thin film transistor array having little variation in transistor characteristics can be produced.

COMPARATIVE EXAMPLE 1

Figure 6:
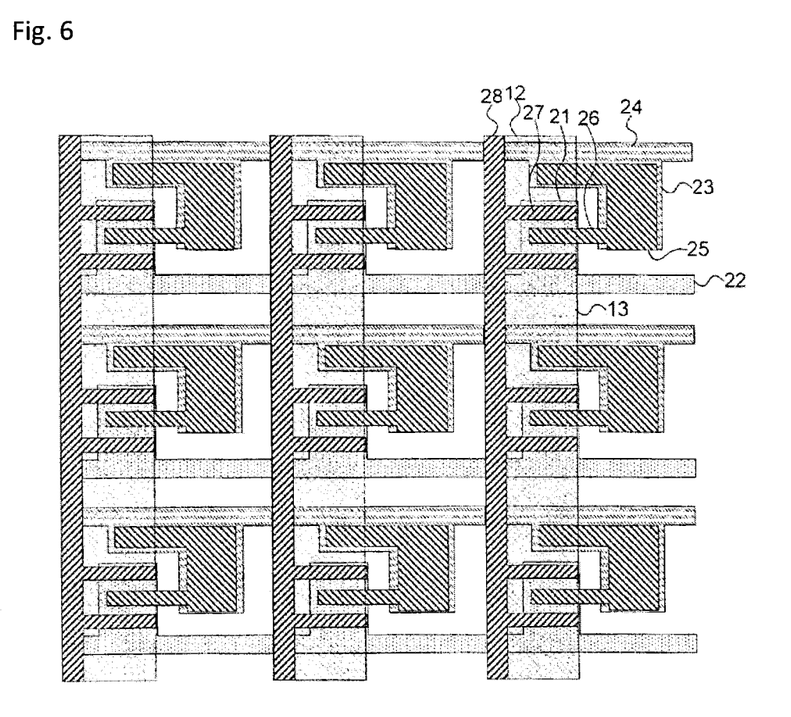
FIG. 6 is a planar view showing a configuration of a thin film transistor array according to comparative example 1.

FIG. 6 is a planar view showing a configuration of a thin film transistor array of comparative example 1. The thin film transistor array of the comparative example 1 as shown in FIG. 6 was provided such that, compared to the thin film transistor array according to the example 1, the width of the semiconductor layer connection line 12 in the non-channel region and the width of the semiconductor layer 13 in the channel region were the same. As a result, compared to the example 1, since the semiconductor layer connection line 12 was contacted with the pixel electrode 25, current flowed between the source electrode 27 and the pixel electrode 25 even during the off state so that the on/off ratio became small. Thus, excellent transistor characteristics were not able to be obtained.

COMPARATIVE EXAMPLE 2

Figure 7:
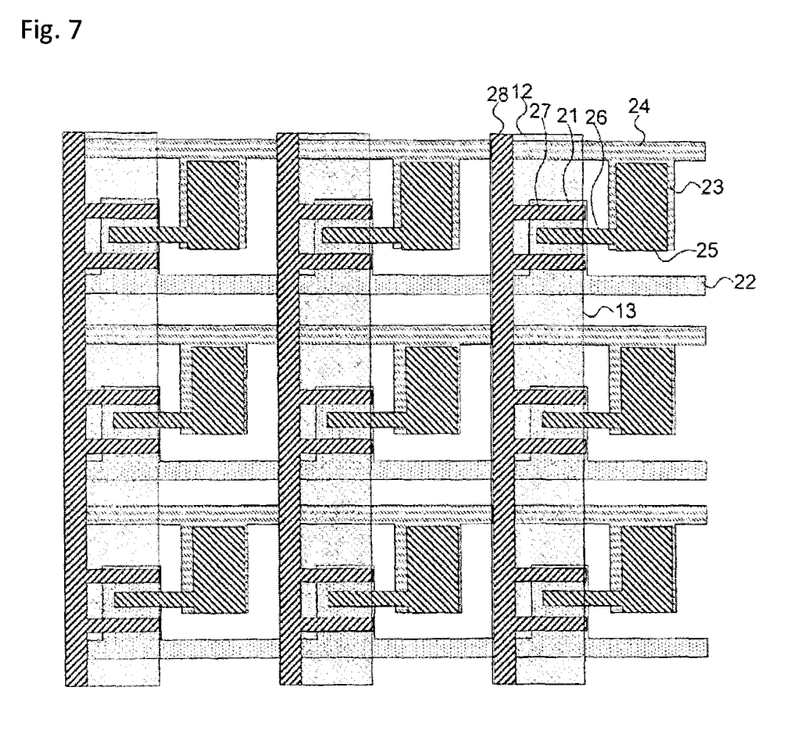
FIG. 7 is a planar view showing a configuration of a thin film transistor array according to comparative example 2.

FIG. 7 is a planar view showing a thin film transistor array according to comparative example 2. The thin film transistor array of the comparative example 2 as shown in FIG. 7 was provided such that, compared to the thin film transistor array according to the example 1, the pixel electrode 25 was formed to be small enough not to contact with the semiconductor layer connection line 12. As a result, leak current became small and the on/off ratio became large. However, since the pixel electrode 25 was small, the charge storage capacity became small.

COMPARATIVE EXAMPLE 3

Figure 8:
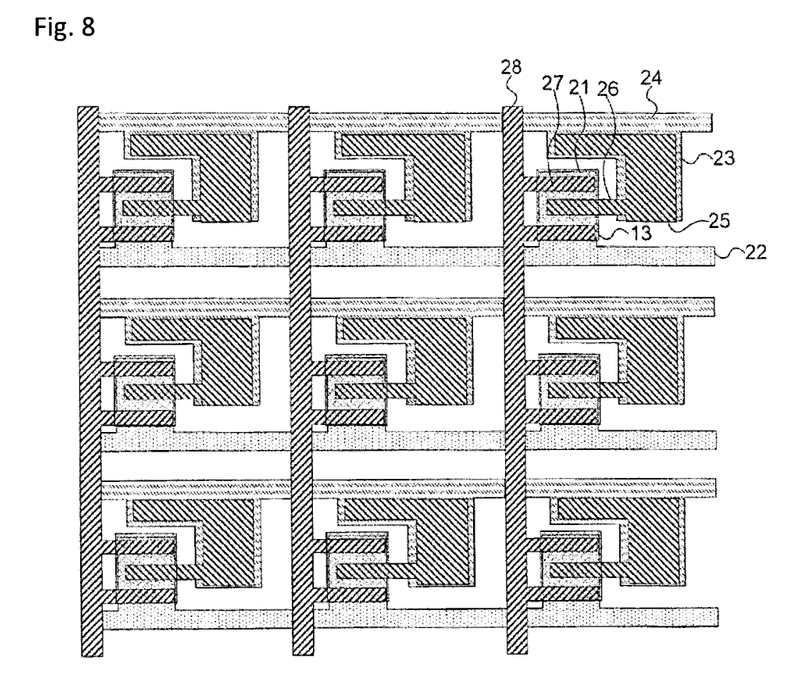
FIG. 8 is a planar view showing a configuration of a thin film transistor array according to comparative example 3.

FIG. 8 is a planar view showing a thin film transistor array according to comparative example 3. The thin film transistor array of the comparative example 3 as shown in FIG. 8 was provided such that, compared to the thin film transistor array according to the example 1, the semiconductor layer connection line was removed. As a result, the on/off ratio and the charge storage capacity were not changed, however, variation in the transistor characteristics became large.

When using the inkjet method, generally, since the organic semiconductor has low solubility in the solvent, the organic semiconductor may be deposited in the vicinity of the nozzle, causing frequent occurrence of discharge failure. To provide fine patterns by the inkjet method, it is necessary to dispose a barrier wall around the pattern formation portion and control a wettability of a surface of the substrate in advance by using photoirradiation, which causes difficulty in reducing manufacturing cost in addition to complexity.

Moreover, when using flexographic printing, in a case where an organic semiconductor solvent is transcribed to a flexographic plate from anilox, an amount of liquid to be transcribed differs between a case when the convex portion of the flexographic plate is inserted into the concave portion of the anilox and a case when the convex portion of the flexographic plate overlaps with a bank portion. As a result, a thickness of the formed film varies. The variance of the formed film results in a variance of the characteristics of the thin film transistor. When using letterpress offset printing, after coating ink on the whole surface of the blanket having release properties, unnecessary portions are eliminated so as to obtain desired pattern. Therefore, efficiency of utilization of the ink is poor and as a result cost reduction cannot be achieved. It is possible for the eliminated ink to be collected to be utilized. However, usually, the blanket used for the letterpress offset printing is made of silicone so that residual silicone oligomer is mixed into the ink. Hence, the ink is required to be refined again.

In light of the above-described circumstances, in the present invention, as a result of intensive studies in order to achieve a thin film transistor array having characteristics in which high throughput, excellent alignment accuracy, high on/off ratio and small variance between elements are accomplished, an arrangement of the thin film transistor array is optimized to be capable of forming an organic semiconductor layer in a stripe shape. Then, the organic semiconductor layer is formed in the stripe shape and a width of the stripe in a non-channel region is formed to be narrower than a width of the stripe shape in the channel region, whereby the thin film transistor array having above-described characteristics and the method of manufacturing the thin film transistor array are obtained.

The present invention is made in order to solve the above-described problems and can be achieved as the following embodiments or application examples.

To solve the above-described problems, a thin film transistor array according to one aspect of the present invention is characterized in that the thin film transistor array comprises: a thin film transistor including a gate electrode formed on an insulation substrate, a source electrode and a drain electrode formed on the gate electrode via a gate insulation film and a semiconductor layer formed on a region of the gate electrode surrounded by at least the source electrode and the drain electrode; a capacitor including a capacitor electrode formed on the insulation substrate and a pixel electrode which is formed on the capacitor electrode via the gate insulation film and connected to the drain electrode, a combination of the thin film transistor and the capacitor being arranged in a first direction and a second direction perpendicular to the first direction in a plural number so as to form a matrix; a plurality of source wirings that mutually connects source electrodes of a plurality of the thin film transistors arranged in the first direction of the matrix; a plurality of gate wirings that mutually connects gate electrodes of a plurality of the thin film transistors arranged in the second direction of the matrix; a plurality of capacitor wirings that mutually connects capacitor electrodes of a plurality of the capacitors arranged in the second direction of the matrix; and a plurality of semiconductor layer connection lines that mutually connects semiconductor layers of a plurality of the thin film transistors arranged in the first direction of the matrix, in which a width of the semiconductor layer connection line is narrower than a width of the semiconductor layer of the thin film transistor.

According to this configuration, since a plurality of the semiconductor layer connection lines are arranged to have a stripe shape in a vertical direction, high throughput and high alignment accuracy can be achieved and also, since a width of the semiconductor layer connection line is narrower than a width of the semiconductor layer in the channel region, the area of the pixel electrode can be large. Accordingly, when the thin film transistor array is used as a backboard for driving a display, the amount of charge storage capacity is able to be large so that stable driving can be achieved. Moreover, according to this configuration, a plurality of the semiconductor layer connection lines are arranged in the same direction as a direction of the source wiring, whereby leak current can be reduced between adjacent transistors which are connected by the semiconductor layer connection line.

To solve the above-described problems, a thin film transistor array according to another aspect of the present invention is characterized in that each of the semiconductor layer and the semiconductor layer connection line are formed by an organic semiconductor. According to this configuration, each of the semiconductor layer and the semiconductor layer connection line are formed of an organic semiconductor, whereby the semiconductor layer and the semiconductor layer connection line are able to be formed by a printing method. Therefore, the manufacturing process of the thin film transistor can be made easy and the cost can be low.

To solve the above-described problems, a thin film transistor array according to another aspect of the present invention is characterized in that the pixel electrode is not overlapped with the semiconductor layer. According to this configuration, the pixel electrode is not contacted with the semiconductor layer so that current is unlikely to flow between the source wiring and the pixel electrode even in an off state. Therefore, on/off ratio can be large.

To solve the above-described problems, a thin film transistor array according to an embodiment of the present invention is characterized in that the source electrode is provided with a plurality of convex portions extending to the second direction from the source wiring, the plurality of convex portions of the source electrode being formed at outer side of the drain electrode, at least in a region where the semiconductor layer is formed, and tip portions of the convex portions formed at outer side of the drain electrode are not covered by the semiconductor layer.

According to this configuration, since the plurality of source electrodes that constitute the thin film transistor is provided with the convex portion located at outer side of the drain electrode, and the tip portion of the convex portion is not covered by the semiconductor layer, respective thin film transistors adjacent to each other in a direction parallel to the source wiring can be electrically isolated. As a result, off current can be reduced.

To solve the above-described problems, a thin film transistor array according to another aspect of the present invention is characterized in that the source electrode is a concave portion formed in the source wiring, having a region where the source wiring and the semiconductor layer connection line are not overlapped in a side portion where the concave portion of the source wiring is formed. According to this configuration, the area that the thin film transistor occupies can be smaller compared with a case where the source electrode is formed as a convex portion protruded from the source electrode, and larger aperture ratio for the pixel is possible. Further, respective thin film transistors which are adjacent in a direction parallel to the source wiring can be electrically isolated, thereby reducing off current.

To solve the above-described problems, a thin film transistor array according to another aspect of the present invention is characterized in that the insulation substrate is a flexible substrate. According to this configuration, since the insulation substrate is a flexible substrate, is has flexibility, shock-resistance and lightweight. Hence, these properties can also be applied to devices which are driven by the thin film transistor array.

As described above, according to an aspect of the present invention, an arrangement of the thin film transistor array is optimized so as to have the semiconductor layer formed in a stripe shape. Accordingly, high throughput and high alignment accuracy can be accomplished even when the semiconductor layer is formed by a printing method. Further, the width of the stripe shape in the non-channel region is formed to be narrower than the width of the stripe shape in the channel region, and therefore the thin film transistor array can easily be positioned.

DESCRIPTION OF REFERENCE NUMERALS

10: insulation film
11: gate insulation film
12: semiconductor layer connection line
13: semiconductor layer
21: gate electrode
22: gate wiring
23: capacitor electrode
24: capacitor wiring
25: pixel electrode
26: drain electrode
27: source electrode
28: source wiring Obviously, numerous modifications and variations of the present invention are possible in light of the above teachings. It is therefore to be understood that within the scope of the appended claims, the invention may be practiced otherwise than as specifically described herein.

What is claimed is:

1. A thin film transistor array, comprising:
a plurality of thin film transistors each including a gate electrode formed on an insulation substrate, a source electrode and a drain electrode formed on the gate electrode via a gate insulation film and a semiconductor layer formed on a portion of the gate electrode surrounded by at least the source electrode and the drain electrode;
a plurality of capacitors each including a capacitor electrode formed on the insulation substrate and a pixel electrode which is formed on the capacitor electrode via the gate insulation film and connected to the drain electrode, the capacitors and the thin film transistors being positioned in a plane along a first direction and a second direction perpendicular to the first direction;
a plurality of source wirings that extend in the first direction and connect source electrodes of the thin film transistors positioned in the first direction; and
a plurality of semiconductor layer connection lines that at least partially overlap the plurality of source wirings along an entirety of a length of the plurality of source wirings in the first direction, the plurality of semiconductor layer connection lines comprising a semiconductor material and extending continuously in the first direction together with the plurality of source wirings, with which the plurality of semiconductor layer connection lines at least partially overlap, to directly connect to the semiconductor layers included in different groups of the thin film transistors positioned in the first direction in channel regions, wherein
a width of the semiconductor layer connection lines, which at least partially overlap the plurality of source wirings along the entirety of the length of the plurality of source wirings in the first direction, in non-channel regions is smaller than a width of the semiconductor layer connection lines with the semiconductor layers of the thin film transistors in the channel regions.

2. The thin film transistor according to claim 1, further comprising:
a plurality of gate wirings that connect gate electrodes of the thin film transistors positioned in the second direction; and
a plurality of capacitor wirings that connect capacitor electrodes of the capacitors positioned in the second direction.

3. The thin film transistor according to claim 2, wherein the semiconductor layers and the semiconductor layer connection lines are each formed by an organic semiconductor.

4. The thin film transistor according to claim 3, wherein the pixel electrode is overlapped with neither the semiconductor layer nor the semiconductor layer connection line.

5. The thin film transistor array according to claim 3, wherein the source electrode has at least one convex portion extending to the second direction from the source wiring, the convex portion is formed on an outer side of the drain electrode at least in a portion where the semiconductor layer is formed, and the convex portion has an end portion which is formed on the outer side of the drain electrode and is not covered by the semiconductor layer.

6. The thin film transistor array according to claim 5, wherein the insulation substrate is a flexible substrate.

7. The thin film transistor array according to claim 3, wherein the source electrode is a concave portion formed in the source wiring, and the semiconductor layer connection line has a portion where the source wiring and the semiconductor layer connection line are not overlapped on a side where the concave portion is formed.

8. The thin film transistor array according to claim 3, wherein the insulation substrate is a flexible substrate.

9. The thin film transistor according to claim 2, wherein the pixel electrode is overlapped with neither the semiconductor layer nor the semiconductor layer connection line.

10. The thin film transistor array according to claim 9, wherein the source electrode has at least one convex portion extending to the second direction from the source wiring, the convex portion is formed on an outer side of the chain electrode at least in a portion where the semiconductor layer is formed, and the convex portion has an end portion which is formed on the outer side of the drain electrode and is not covered by the semiconductor layer.

11. The thin film transistor array according to claim 9, wherein the source electrode is a concave portion formed in the source wiring, and the semiconductor layer connection line has a portion where the source wiring and the semiconductor layer connection line are not overlapped on a side where the concave portion is formed.

12. The thin film transistor array according to claim 9, wherein the insulation substrate is a flexible substrate.

13. The thin film transistor array according to claim 2, wherein the source electrode has at least one convex portion extending to the second direction from the source wiring, the convex portion is formed on an outer side of the drain electrode at least in a portion where the semiconductor layer is formed, and the convex portion has an end portion which is formed on the outer side of the drain electrode and is not covered by the semiconductor layer.

14. The thin film transistor array according to claim 13, wherein the insulation substrate is a flexible substrate.

15. The thin film transistor array according to claim 2, wherein the source electrode is a concave portion formed in the source wiring, and the semiconductor layer connection line has a portion where the source wiring and the semiconductor layer connection line are not overlapped on a side where the concave portion is formed.

16. The thin film transistor array according to claim 2, wherein the insulation substrate is a flexible substrate.

17. The thin film transistor according to claim 1, wherein the semiconductor layers and the semiconductor layer connection lines are each formed by an organic semiconductor.

18. The thin film transistor according to claim 1, wherein the pixel electrode is overlapped with neither the semiconductor layer nor the semiconductor layer connection line.

19. The thin film transistor array according to claim 1, wherein the insulation substrate is a flexible substrate.

20. The thin film transistor array according to claim 15, wherein the insulation substrate is a flexible substrate.

* * * * *